(12) United States Patent
Shih

(10) Patent No.: US 8,441,305 B2
(45) Date of Patent: May 14, 2013

(54) LOW-LEAKAGE DIODES AND METHODS OF FORMING THE SAME

(75) Inventor: David Hwa Chieh Shih, San Ramon, CA (US)

(73) Assignee: Analog Devices, Inc., Norwood, MA (US)

( * ) Notice: Subject to any disclaimer, the term of this patent is extended or adjusted under 35 U.S.C. 154(b) by 198 days.

(21) Appl. No.: 12/871,650

(22) Filed: Aug. 30, 2010

(65) Prior Publication Data

US 2012/0049934 A1    Mar. 1, 2012

(51) Int. Cl.
    *H03K 17/60*      (2006.01)

(52) U.S. Cl.
    USPC ............ 327/478; 327/493; 327/504; 327/545

(58) Field of Classification Search .................. 327/478, 327/493, 504, 545
    See application file for complete search history.

(56) References Cited

U.S. PATENT DOCUMENTS

| | | | | |
|---|---|---|---|---|
| 3,726,270 A * | 4/1973 | Griffis et al. | .................. | 600/532 |
| 4,288,694 A * | 9/1981 | Ahrons | .......................... | 250/374 |
| 4,342,318 A * | 8/1982 | Engle et al. | .................... | 600/521 |
| 5,023,951 A * | 6/1991 | Kahn | ............................. | 398/202 |
| 5,702,431 A * | 12/1997 | Wang et al. | ...................... | 607/61 |
| 6,069,502 A * | 5/2000 | Preslar et al. | .................... | 327/94 |
| 6,429,696 B1 * | 8/2002 | Kao et al. | ......................... | 327/58 |
| 6,563,724 B2 * | 5/2003 | Carsten | ........................... | 363/89 |
| 6,750,660 B2 * | 6/2004 | Dickerman et al. | .......... | 324/691 |
| 7,692,975 B2 * | 4/2010 | Porter | ....................... | 365/189.06 |
| 7,940,089 B2 * | 5/2011 | Chou et al. | ....................... | 327/60 |
| 8,111,094 B2 * | 2/2012 | Fischer | ........................... | 327/407 |
| 2009/0141413 A1 | 6/2009 | Carroll et al. | | |

OTHER PUBLICATIONS

Salcedo et al., Electrostatic Discharge Protection Framework for Mixed-Signal High Voltage CMOS Applications, downloaded Feb. 23, 2010 from IEEE Xplore, 4 pages.

\* cited by examiner

*Primary Examiner* — Kenneth B. Wells
(74) *Attorney, Agent, or Firm* — Knobbe, Martens, Olson & Bear, LLP

(57) ABSTRACT

Low leakage diodes and methods of forming the same are disclosed. In one embodiment an apparatus includes a designed or parasitic bipolar transistor having an emitter, a base and a collector. The bipolar transistor is configured to operate as a diode, the diode having reverse-biased and forward-biased modes of operation. The emitter and base operate as first and second terminals of the diode, respectively. The collector is configured to receive a collector bias voltage, which is controlled relative to a voltage of the emitter to reduce a diffusion leakage current of the diode when the diode is in the reverse-biased mode of operation.

17 Claims, 10 Drawing Sheets

LOW-LEAKAGE DIODES AND METHODS OF FORMING THE SAME

BACKGROUND

1. Field

Embodiments of the invention relate to electronics, and more particularly, to diodes.

2. Description of the Related Technology

Diodes can be employed in leakage sensitive circuits. For example, diodes can be placed at the input of a high impedance sensor to provide electrostatic discharge (ESD) protection to the circuit. Diode leakage can affect circuit performance, for example, in the case of a high-impedance sensor, diode leakage can lead to sensor error, and the impact of the diode leakage on circuit accuracy can be exacerbated by increases in voltage and/or temperature.

Similarly, parasitic diode formations can inherently form in certain integrated circuit (IC) structures. For example, n-type or p-type diffusion regions and/or wells disposed on a semiconductor substrate can result in the formation of various PN junction diode structures. These parasitic PN junction diodes can be present on leakage-sensitive nodes of an IC, and can impact performance of the IC.

There is a need for diodes having reduced leakage current.

SUMMARY

In one embodiment, an apparatus comprises a bipolar transistor configured to operate as a diode. The diode can be biased in a forward-biased mode of operation, a reverse-biased mode of operation, and an equilibrium mode of operation. The bipolar transistor comprises an emitter for operating as a first terminal of the diode, a base for operating as a second terminal of the diode, and a collector for receiving a collector bias voltage. The collector bias voltage is configured relative to a voltage of the emitter to minimize a diffusion leakage current of the diode when the diode is in the reverse-biased mode of operation.

In another embodiment, a method of providing a diode is disclosed. The diode can be biased in a forward-biased mode of operation, a reverse-biased mode of operation, and an equilibrium mode of operation. The method comprises providing a bipolar transistor having an emitter, a base, and a collector, configuring the emitter to operate as a first terminal of the diode, and configuring the base to operate as a second terminal of the diode. The method further comprises biasing a voltage of the collector relative to a voltage of the emitter to minimize a diffusion leakage current of the diode when the diode is in the reverse-biased mode of operation.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of the preferred embodiments having reference to the attached figures, the invention not being limited to any particular preferred embodiment(s) disclosed.

DETAILED DESCRIPTION OF EMBODIMENTS

Figure 1A:
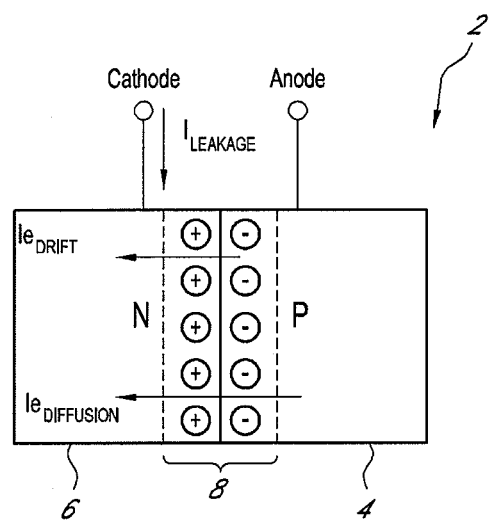
FIG. 1A is a schematic block diagram of a reverse-biased PN junction diode.

In certain embodiments described herein, a bipolar transistor operates as a low-leakage diode. The bipolar transistor includes an emitter, a base, and a collector, and the base-emitter PN junction acts as the diode. To minimize the leakage current of the diode, the collector voltage is controlled relative to the emitter voltage. By biasing the collector voltage so as to reduce the voltage difference between the emitter and the collector, leakage current of the diode can be reduced relative to designs in which an isolated PN junction diode is used, or in which the collector voltage is biased at a fixed potential.

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

Overview of Diode Leakage

FIG. 1A is a schematic block diagram of a reverse-biased PN junction diode 2. The PN junction diode 2 includes an anode 4 disposed adjacent to a cathode 6. The anode 4 is a p-type doped semiconductor, and the cathode 6 is an n-type doped semiconductor.

The current-voltage (I-V) characteristics of the PN junction diode 2 can be based on a difference in voltage potential between the anode 4 and the cathode 6. For example, when the voltage potential of the anode 4 is greater than the voltage potential of the cathode 6, the diode 2 can be in a forward-biased mode of operation in which the PN junction diode 2 conducts a relatively large current. Additionally, when the voltage potential of the anode 4 is less than the voltage potential of the cathode 6, the diode 2 is in a reverse-biased mode of operation, in which the PN junction diode 2 conducts a relatively small current, referred to herein as the leakage current $I_{LEAKAGE}$. When the voltage potential of anode 4 is equal to about the voltage potential of the cathode 6, the diode 2 can be in an equilibrium mode of operation in which no current is conducted.

Under certain biasing conditions, such as when the PN junction diode 2 is reverse-biased or in equilibrium, a space charge region 8 can exist near the boundary of the anode 4 and the cathode 6 of the PN junction diode 2. The carrier concentration in the space charge region 8 can be reduced relative to the carrier concentrations in other portions of the anode 4 and cathode 6. The depletion of carriers in the space charge region 8 can result from, for example, recombination of electrons diffusing from the cathode 6 to the anode 4 with holes diffusing from the anode 4 to the cathode 6. The depletion of carriers in the space charge region 8 can lead to a localized charge imbalance, which can create an electric field within the space charge region 8. The width of the space charge region 8 can vary with the voltage applied between the anode 4 and the cathode 6. For example, the width of the space charge region 8 can increase as the reverse-bias voltage between the cathode 6 and the anode 4 increases.

A leakage current $I_{LEAKAGE}$ can be present between the anode 4 and the cathode 6 when the PN junction diode 2 is under reverse-bias. For a PN junction diode having the n-type doping concentration of the cathode 6 greater than the p-type doping concentration of the anode 4, the leakage current of the PN junction diode can include a component $Ie_{DRIFT}$ and a component $Ie_{DIFFUSION}$. The $Ie_{DRIFT}$ component of the leakage current can be associated with the flow of electrons generated from thermal carrier recombination-generation in the space charge region 8 to the cathode 6. The electrons generated in the space charge region 8 can drift from the space charge region 8 to the cathode 6 under the influence of the electric field of the space charge region 8. The $Ie_{DIFFUSION}$ component of the leakage current can be related to the diffusion of electrons arriving at the edge of the space charge region 8 within the anode 4 from the anode 4 to the cathode 6 under the influence of the electric field of the space charge region 8. The leakage current can be expressed using Equation 1 below.

$$I_{LEAKAGE} \sim = Ie_{DRIFT} + Ie_{DIFFUSION} \qquad \text{Equation 1}$$

The $Ie_{DRIFT}$ component of the leakage current can be approximated using Equation 2 below, in which q is the magnitude of the charge of an electron, $n_i$ is the intrinsic carrier concentration, A is the area of the anode 4, $W_D$ is the width of the space charge region 8, and $\tau_g$ is the minority carrier generation lifetime. The width $W_D$ of the space charge region 8 is dependent on the reverse-bias voltage of the diode, as noted above.

$$Ie_{DRIFT} \sim = \frac{qn_i A W_D}{\tau_g} \qquad \text{Equation 2}$$

Additionally, the $Ie_{DIFFUSION}$ component of the leakage current can be approximated using Equation 3 below, in which q, and $n_i$ are defined as above, and wherein $D_n$, is the diffusion coefficient of electrons, $N_A$ is the density of acceptors in the anode, $L_n$ is the diffusion length of electrons, $V_F$ is the voltage difference between the anode 4 and cathode 6, k is Boltzmann's constant, and T is temperature.

$$Ie_{DIFFUSION} \sim = \frac{qAn_i^2 D_n}{N_A L_n}\left[\exp\left(\frac{qV_F}{kT}\right) - 1\right] \qquad \text{Equation 3}$$

The $Ie_{DIFFUSION}$ component of the leakage of the PN junction diode 2 can be zero when $V_F$ is equal to about 0 V. However, the $Ie_{DIFFUSION}$ component of the leakage current can increase as the reverse-bias voltage of the diode 2 increases. In certain applications, the reverse-bias voltage of the diode 2 can vary during operation, and worst-case performance can be determined by the amount of variation in leakage current over a range of reverse-bias voltages. Thus, it can be important to reduce the variation in leakage current over a range of reverse-bias voltages.

Figure 1B:
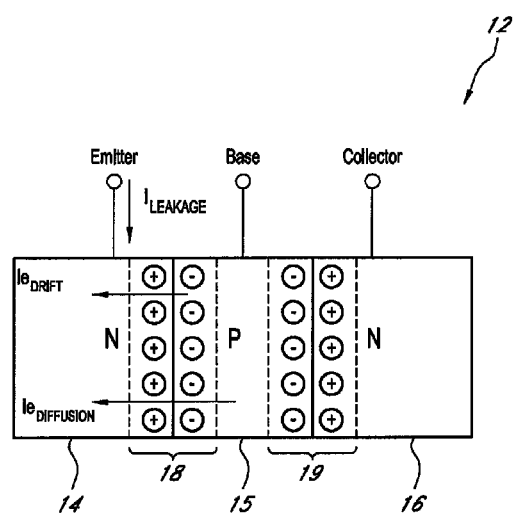
FIG. 1B is a schematic block diagram of an NPN bipolar transistor having reverse-biased base-emitter and base-collector PN junctions.

FIG. 1B is a schematic block diagram of an NPN bipolar transistor 12 having reverse-biased base-emitter and base-collector PN junctions. The NPN bipolar transistor 12 includes an emitter 14, a base 15, and a collector 16. The emitter 14 is an n-type doped semiconductor, the base 15 is a p-type doped semiconductor, and the collector 16 is an n-type doped semiconductor. Although FIG. 1B illustrates an NPN bipolar transistor, persons of ordinary skill in the art will recognize that the principles described herein are applicable to any suitable bipolar transistor configuration, including, for example, a PNP bipolar transistor configuration.

A first PN junction exists between the base 15 and the emitter 14 of the NPN bipolar transistor 12, and a second PN junction exists between the base 15 and the collector 16. The base-emitter PN junction can have a space charge region 18 and the base-collector PN junction can have a space charge region 19.

The collector 16 can be biased so as to place the base-collector PN junction in a reverse-biased mode of operation, and the base 15 and the emitter 14 can be used as a diode. The leakage current $I_{LEAKAGE}$ of the emitter-base PN junction can have a component $Ie_{DRIFT}$ associated with drift of electrons and a component $Ie_{DIFFUSION}$ associated with diffusion of electrons. For an NPN bipolar device in which the n-type doping concentrations of the emitter and the collector are relatively greater than that of the p-type doping concentration of the base, the leakage current $I_{LEAKAGE}$ of the emitter can be expressed using Equation 1 above. Although a discussion of leakage current is provided for one example of an NPN bipolar transistor, persons of ordinary skill in the art will recognize that the principles described herein are applicable to NPN bipolar transistors having different doping profiles and configurations, as well as to PNP bipolar transistors.

The leakage component $Ie_{DIFFUSION}$ of the leakage current of the illustrated NPN bipolar device can be approximated using Equation 4 below, in which q, $n_i$, $\tau_g$ are defined as above, and wherein $A_E$ is the area of the emitter 14 and $W_{D,BE}$ is the width of the base-emitter space charge region 18. The width $W_{D,BE}$ of the base-emitter space charge region 18 is dependent on the reverse-bias voltage of the emitter-base PN junction, as noted above.

$$Ie_{DRIFT} \sim = \frac{qn_i A_E W_{D,BE}}{\tau_g} \qquad \text{Equation 4}$$

The component $Ie_{DIFFUSION}$ of the leakage current of the NPN bipolar transistor can be approximated using Equation 5 below, in which q, $A_E$, $D_n$, $L_n$, k and T are defined as above, and wherein W is the effective base width of the base 15, $V_{BE}$ is the base-emitter voltage and $V_{BC}$ is the base-collector voltage.

$$Ie_{DIFFUSION} \sim = \frac{qA_{Eni}^2 D_n}{N_A L_n} \coth\left(\frac{W}{L_n}\right) \quad \text{Equation 5}$$
$$\left\{\left[\exp\left(\frac{qV_{BE}}{kT}\right)-1\right] - \operatorname{sech}\left(\frac{W}{L_n}\right)\left[\exp\left(\frac{qV_{BC}}{kT}\right)-1\right]\right\}$$

To prevent the base-collector PN junction from becoming forward-biased, the collector voltage can be placed at a relatively high voltage, such as, for example a voltage greater than or equal to about 1 V for a base voltage of about 0 V, so that the base-collector PN junction has a relatively large reverse bias. However, biasing the collector voltage at a relatively high voltage can result in the magnitude of the leakage current $I_{LEAKAGE}$ being relatively large when the reverse bias of the base-emitter PN junction is relatively small. Alternatively, the collector can be biased at a relatively low voltage, such as a voltage equal to about 0 V for a base voltage of about 0 V, so that the base-collector PN junction is in equilibrium. However, biasing the collector voltage so that the base-collector PN junction is in equilibrium can result in the magnitude of the leakage current $I_{LEAKAGE}$ being relatively large when the reverse bias voltage of the base-emitter PN junction is relatively large.

Although FIGS. 1A-1B were discussed in the context of PN junctions in which the n-type doping is relatively larger than the p-type doping, similar equations exist for the case in which the p-type doping is greater than the n-type doping. Additionally, equations incorporating both the diffusion of holes and electrons can be provided when the doping concentrations in the n-type region and the p-type region are relatively similar. However, these equations have been omitted to focus the disclosure on a typical example for an NPN bipolar transistor; the skilled artisan can readily apply the teachings herein to diodes of other types where leakage current should be minimized, including to PNP bipolar transistor configurations.

Figure 2:
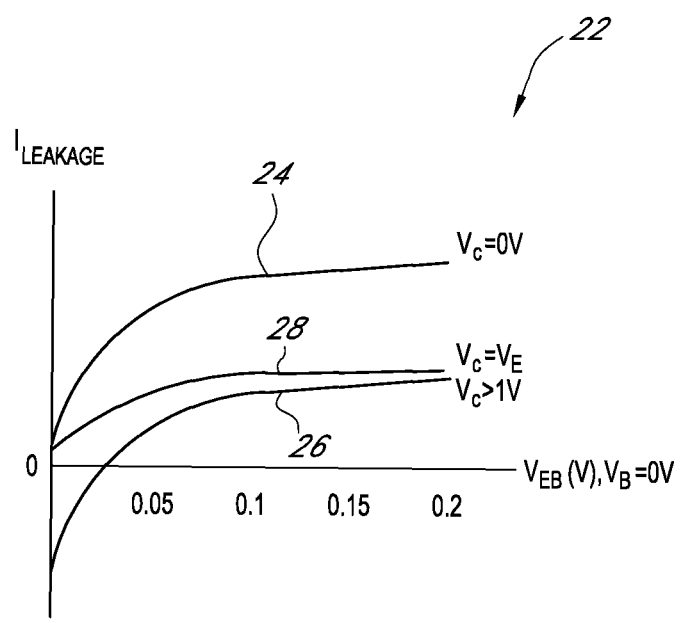
FIG. 2 is a graph of bipolar transistor base-emitter leakage current as a function of base-emitter reverse-bias voltage for three examples of collector bias voltages.

FIG. 2 is a graph 22 of bipolar transistor base-emitter leakage current $I_{LEAKAGE}$ as a function of reverse-bias base-emitter voltage $V_{EB}$ for three examples of collector bias voltages.

The graph 22 includes a plot 24 of leakage current $I_{LEAKAGE}$ of the base-emitter PN junction versus base-emitter reverse-bias voltage $V_{EB}$ when the base and collector have a voltage of about 0 V. As shown in FIG. 2, although the leakage current can be relative small when $V_{EB}$ is small, the leakage current increases as $V_{EB}$ increases. In certain applications, circuit performance can be impacted by the variation in leakage current over a range of $V_{EB}$ voltages. As skilled artisans will appreciate, the plot 24 can correspond to the sum of the leakage current components of Equations 2 and 3 above.

The graph 22 further includes a plot 26 of leakage current $I_{LEAKAGE}$ of the base-emitter PN junction versus base-emitter reverse-bias voltage $V_{EB}$ when the base is at about 0 V and the collector is biased at a relatively large voltage, such a voltage greater than or equal to about 1 V. As shown in plot 26, the leakage current can have a magnitude which is relatively large when the base-emitter reverse-bias voltage is about 0 V. As $V_{EB}$ increases, the magnitude of the leakage current decreases until it reaches a value of about 0 mA. However, as $V_{EB}$ further increases, the magnitude of the leakage current also increases. As skilled artisans will appreciate, the plot 26 can correspond to the sum of the leakage current components of Equations 4 and 5 for a configuration in which the base is biased at about 0 V and the collector is biased at a voltage greater than or equal to about 1 V.

In certain electronics circuits, worst-case performance can be determined by the variation in leakage current over a range of reverse-bias voltages. Although the leakage current $I_{LEAKAGE}$ of the bipolar transistors corresponding to plots 24, 26 can be relatively low at certain bias voltages, the variation in leakage current over the range of base-emitter reverse-bias voltages can be relatively large.

With continuing reference to FIG. 2, the graph 22 includes a plot 28 of the leakage current of the base-emitter PN junction versus base-emitter reverse-bias voltage $V_{EB}$ when the base is biased at about 0 V and the collector voltage is equal to about the emitter voltage. As shown in plot 28, by biasing the collector voltage to be equal to about the emitter voltage, the variation of leakage current over a range of base-emitter reverse-bias voltages can be reduced.

Without being limited by theory, the reduction in leakage current can be understood with reference to Equations 4 and 5 above. If the ratio of $W/L_n$ is selected to be relatively small such that $\operatorname{sech}(W/L_n)$ has a value close to one, the $Ie_{DIFFUSION}$ component of the leakage current can be equal to about 0 mA when the collector and emitter voltages are equal. Thus, by controlling the emitter voltage relative to the collector voltage, the $Ie_{DIFFUSION}$ component of the diode leakage current can be equal to about zero, and thus the total diode leakage current can be equal to about the $Ie_{DRIFT}$ component of the leakage current. Various embodiments of low-leakage diodes will be described below in which the base-emitter PN junction of a bipolar transistor is used as a diode, and the collector voltage is controlled relative to the emitter voltage to reduce the diffusion leakage current of the diode.

Figure 3:
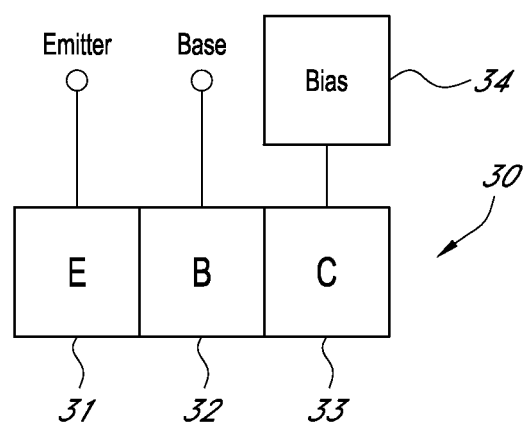
FIG. 3 is a schematic diagram of a bipolar transistor having a collector bias circuit in accordance with one embodiment.

FIG. 3 is a schematic diagram of a bipolar transistor 30 having a collector bias circuit 34 in accordance with one embodiment. The bipolar transistor 30 includes an emitter 31, a base 32, and a collector 33. The bipolar transistor 30 can be an NPN or PNP transistor, and the emitter 31 and base 32 of the bipolar transistor 30 can operate as first and second terminals of a PN junction diode. For example, the emitter of a PNP bipolar transistor can operate as an anode of the diode, and the base of the PNP bipolar transistor can operate as a cathode of the diode.

The collector of the bipolar transistor 30 has a voltage controlled by the bias circuit 34. The bias circuit 34 biases the collector voltage relative to the emitter voltage so as to reduce the leakage current of the base-emitter PN junction diode. This advantageously permits the use the base-emitter PN junction of the bipolar transistor 30 as a low-leakage diode. The bias circuit 34 can be, for example, any electronic circuit for controlling the collector voltage so as to reduce a voltage difference between the emitter and collector. For example, the bias circuit 34 can be a gain circuit, such as a buffer circuit, as will be described in further detail below with respect to FIGS. 4A-4B.

With reference back to Equation 5, the $Ie_{DIFFUSION}$ component of the leakage current can be expressed as a difference between a first exponential based on the base-emitter reverse-bias voltage and a second exponential based on the base-collector reverse-bias voltage.

In one embodiment, the bias circuit is configured to bias the collector voltage so that the magnitude of the difference between the emitter and collector voltages is less than about 10 mV, and particularly less than about 5 mV, when the base-emitter reverse-bias voltage is between about 0 mV and about 100 mV. Furthermore, for base-emitter reverse-bias voltages greater than about 100 mV, the bias circuit is configured to bias the collector voltage so that the collector-base PN junction is reversed biased with a voltage greater than about 90 mV. A relatively greater difference between the emitter and collector voltages can be used to obtain similarly low leakage current when the base-emitter voltage is greater than about 100 mV, since the exponential based on the base-emitter voltage can be relatively small when the base-emitter reverse-bias voltage is greater than about 100 mV.

Figure 4A:
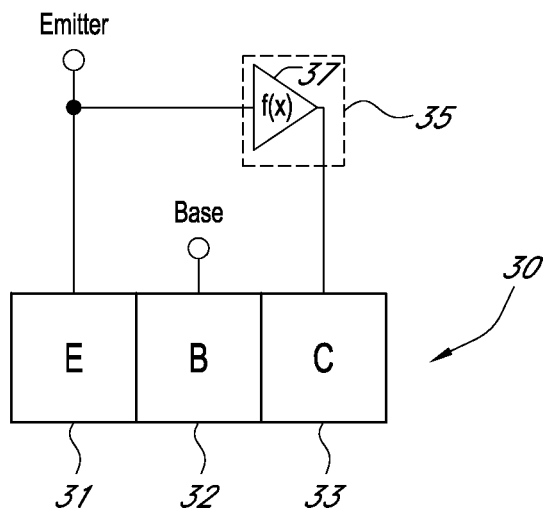
FIG. 4A is a schematic diagram of a bipolar transistor having a collector bias circuit in accordance with another embodiment.
Figure 4B:
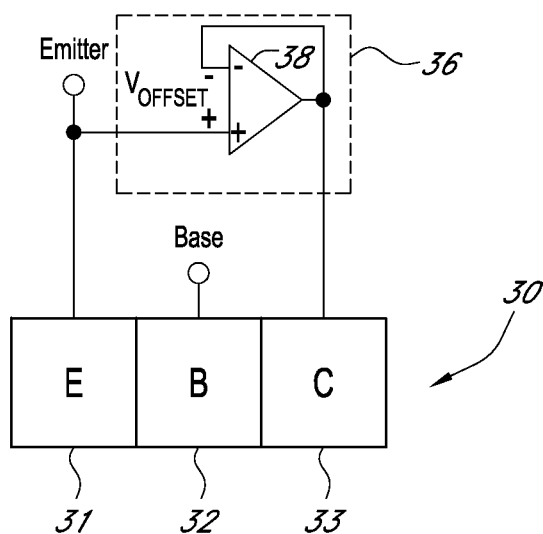
FIG. 4B is a schematic diagram of a bipolar transistor having a collector bias circuit in accordance with yet another embodiment.

The collector bias circuit 34 can use the emitter voltage as a reference signal to aid in biasing the collector, as shown in FIGS. 4A-4B below, and thereby have some dependency on emitter voltage. Nevertheless, the collector bias circuit 34 need not be electrically connected to the emitter 31. For example, a signal having a calculable relationship to the emitter voltage can be used to generate the collector voltage so as to control a voltage difference between the emitter 31 and collector 33.

The collector bias circuit 34 and the bipolar transistor 30 can be placed on the same, or on different ICs. In one embodiment, the bipolar transistor 30 is disposed on a first integrated circuit, and the collector 33 is electrically connected to a bonding pad disposed on a surface of the integrated circuit. This permits a bias circuit 34 disposed on a second integrated circuit to bias the collector 33.

FIG. 4A is a schematic diagram of a bipolar transistor 30 having a collector bias circuit 35 in accordance with another embodiment. The bipolar transistor 30 includes an emitter 31, a base 32 and a collector 33. The base 32 and emitter 31 can be used as a PN junction diode, and the collector 33 can be controlled by the collector bias circuit 35 to minimize a diffusion leakage current between the emitter 31 and the base 32.

The collector bias circuit 35 can include a gain circuit 37 for biasing the voltage of the collector 33 relative to the voltage of the emitter 31. The gain circuit 37 can include an input electrically connected to the emitter 31, and an output electrically connected to the collector 33. The gain circuit 37 can be a linear or non-linear circuit, and can control the output voltage relative to the input voltage. For example, the gain circuit 37 can be a buffer circuit, implemented with or without using an operational amplifier. The gain circuit 37 can be configured such that the magnitude of the difference between the emitter and collector voltages is less than about 10 mV, and more particularly less than about 5 mV, when the base-emitter reverse-bias voltage is between about 0 mV and about 100 mV. For base-emitter voltages greater than about 100 mV, the gain circuit 37 can be configured to bias the collector-base PN junction to a reverse-bias voltage greater than about 90 mV.

FIG. 4B is a schematic diagram of a bipolar transistor 30 having a collector bias circuit 36 in accordance with yet another embodiment. The bipolar transistor 30 includes an emitter 31, a base 32 and a collector 33. The base 32 and emitter 31 can be used as a PN junction diode, and the collector 33 can be biased by the collector bias circuit 36 to reduce the leakage current of the base-emitter PN junction diode.

The collector bias circuit 36 can include an operational amplifier 38 having a positive input, a negative input, and an output. The operational amplifier 38 can have an offset voltage $V_{OFFSET}$. The output of the operational amplifier 38 can be connected to the negative input of the operational amplifier 38 and to the collector 33. The positive input of the operational amplifier 38 can be electrically connected to the emitter 31. As skilled artisans will appreciate, the operational amplifier 38 is connected in a negative feedback configuration as a buffer circuit. Thus, the operational amplifier 38 can bias the collector to a voltage equal to about the emitter voltage minus $V_{OFFSET}$. Since the magnitude of the leakage current of the base-emitter PN junction can be based on a difference between the emitter and collector voltages as described earlier, the offset voltage can be controlled to aid in reducing the leakage current. In one embodiment, the magnitude of $V_{OFFSET}$ is less than about 10 mV, or more particularly, less than about 5 mV.

Figure 5A:
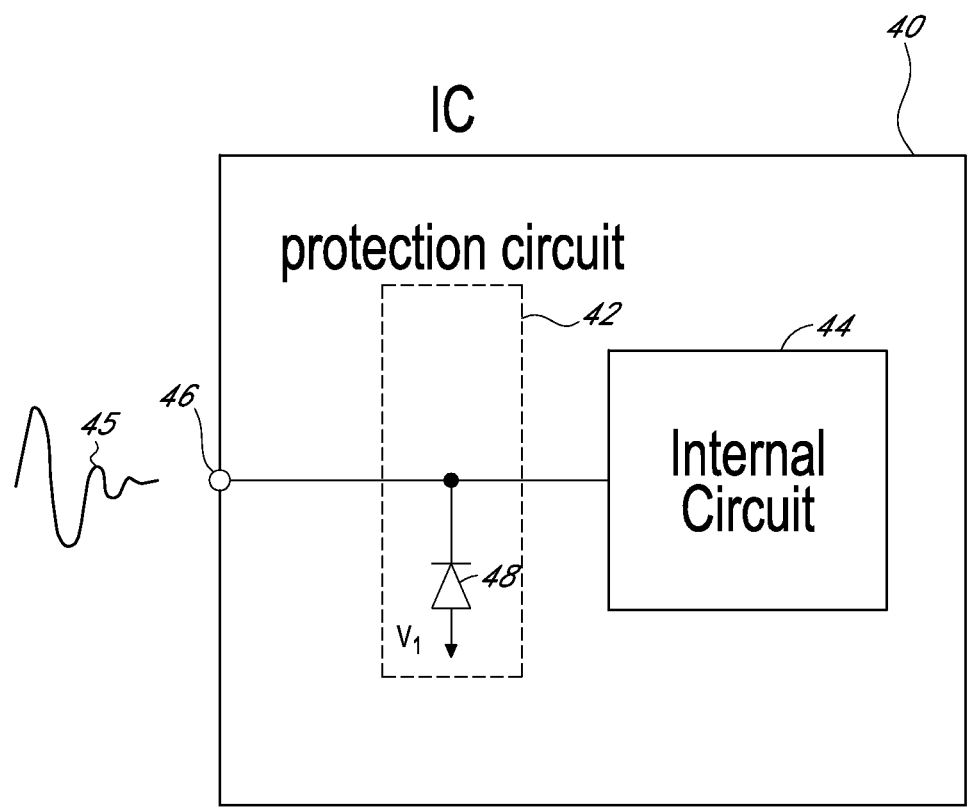
FIG. 5A is a block diagram of an IC having a protection circuit in accordance with one embodiment.

FIG. 5A is a block diagram of an integrated circuit or IC 40 having a protection circuit 42 in accordance with one embodiment. The protection circuit 42 can include a number of unillustrated circuit elements, and is shown to include a diode 48, which can aid protecting an internal circuit 44 of the IC 40 from electrostatic discharge (ESD) events received on a pad 46. The pad 46 can be, for example, a power pad, a ground pad, an input pad, an output pad, or a bidirectional pad.

The IC 40 can be exposed to an ESD event, which can cause IC damage and/or induce latch-up of the IC 40 if a protection circuit is not provided. For example, the pad 46 can receive an ESD event 45, which can travel along electrical connections of the IC 40 and reach the internal circuit 44, and thereafter produce overvoltage conditions and high levels of power dissipation. High power dissipation can increase IC temperature, and can lead to numerous problems, such as gate oxide punch-through, junction damage, metal damage, and surface charge accumulation. Moreover, the ESD can induce latch-up (in other words, inadvertent creation of a low-impedance path), thereby disrupting the functioning of the IC 40 and potentially causing permanent damage to the IC 40 from self-heating in the latch-up current path.

The pad protection circuit 42 can protect the IC 40 by maintaining the voltage level at the pad 46 of the IC 40 within a particular range of voltage. The pad protection circuit 42 can be configured to divert a current associated with an ESD event received on the pad 42 to other nodes or pads of the IC, thereby providing ESD event protection.

The pad protection circuit 42 can include diode 48 connected between the voltage reference $V_1$ and the pad 46. The diode 48 can protect the internal circuit 44 against ESD events having either positive or negative voltage amplitude, as will be described below. The diode 48 can have an anode electrically connected to the voltage reference $V_1$ and a cathode electrically connected to the pad 46. However, skilled artisans will appreciate that the principles described herein are also applicable to other configurations, including, for example, a configuration in which the anode of the diode is electrically connected to the pad 46 and the cathode of the diode is electrically connected to a voltage reference.

During normal operation, the voltage of the pad 46 can vary over a range of voltages such that the diode 48 remains in a reverse-biased or equilibrium mode of operation.

When the voltage at the pad 46 drops below the voltage reference $V_1$ due to an ESD event 46, the diode 48 can become forward-biased and conduct a relatively large current, which can aid in protecting the IC 40 from undervoltage conditions by diverting the charge associated with the ESD event 46 and increasing the voltage level at the pad 46. Additionally, when the voltage of the pad 46 rises above the voltage reference $V_1$ due to an ESD event 46, the diode 48 can reach a breakdown condition, such as an avalanche breakdown condition, and conduct a relative large current, thereby reducing the voltage level at the pad 46. Thus, the diode 48 can provide ESD event protection from ESD events having either positive or negative voltage amplitudes. Additional diodes can be employed in parallel with diode 48 to achieve the desired amount of ESD protection. For example, doubling the number of diodes in parallel can double the magnitude of current conducted for a particular overvoltage or undervoltage condition at the pad 46. Furthermore, the protection circuit 42 can include other protection circuitry in addition to the diode 48, including, for example, transistors and/or additional diode structures.

The internal circuit 44 can be sensitive to the leakage current of the diode 48. For example, the internal circuit 44 can be a high-impedance sensor, such as, for example, a complementary-metal-oxide-semiconductor (CMOS) amplifier. The sensor can have a sensor error that is affected by leakage of the diode 48. For a particular application, it can be desired that the leakage current have a magnitude less than a specified amount at a specified temperature. For example, for a pH sensor application it can be desired that the leakage current have a magnitude less than about 20 pA at about room temperature, while in a photo diode sensor application it can be desired that the leakage current have a magnitude less than about 1 nA at about room temperature. However, skilled artisans will appreciate that the desired magnitude of the leakage current can vary depending on a variety of factors.

To control the leakage current of the diode 48, the diode can be implemented using the base-emitter junction of a bipolar transistor having a controlled collector voltage. For example, the collector voltage of the bipolar transistor can be controlled relative to the emitter voltage to reduce the diffusion leakage current between the emitter and the base, as described above with respect to FIGS. 3-4B.

Figure 5B:
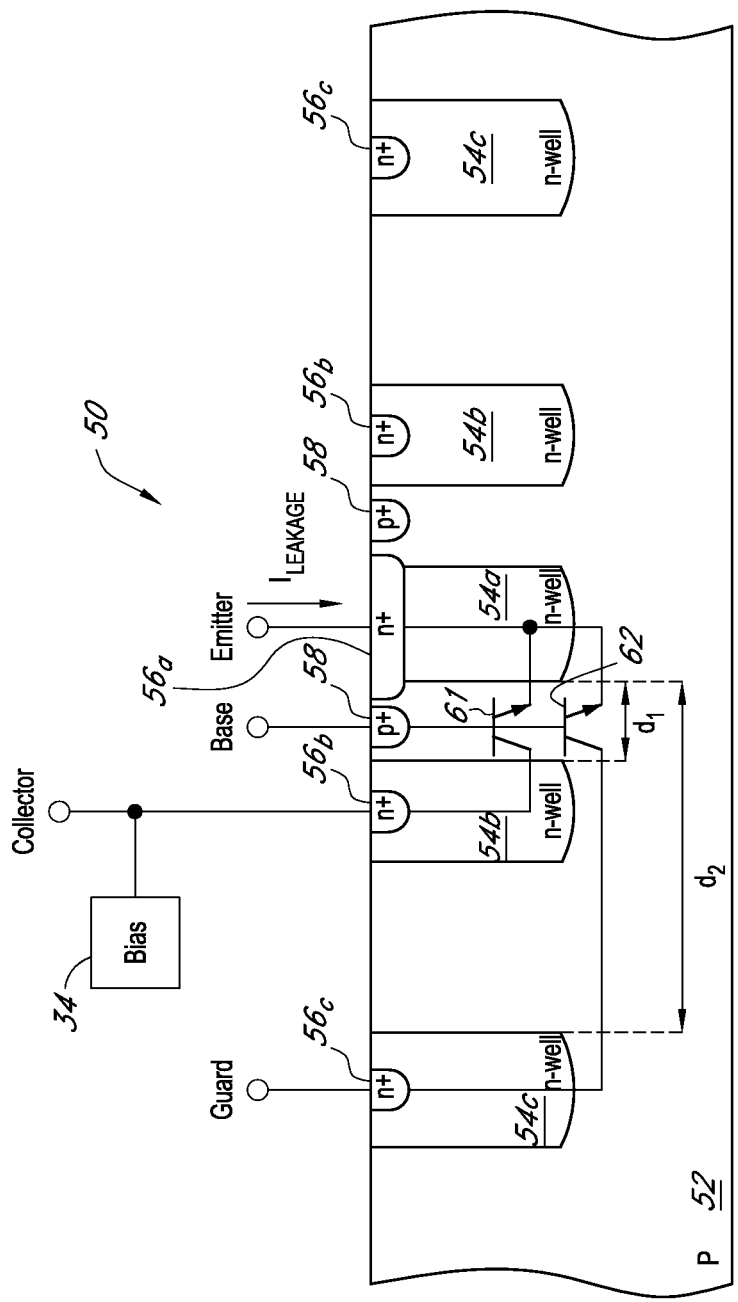
FIG. 5B is a cross section of a protection circuit in accordance with one embodiment.

FIG. 5B is a cross section of a diode protection circuit 50 in accordance one embodiment. The diode protection circuit 50 includes a substrate 52, n-wells 54a-54c, n-type active areas 56a-56c, and p-type active areas 58. The diode protection circuit 50 can be biased by the bias circuit 34. As skilled artisans will appreciate, n-wells 54b-54c, n-type active areas 56b-56c, and p-type active areas 58 can each be annularly shaped when viewed from above the substrate 52. For example, n-wells 54b-54c, n-type active areas 56b-56c, and p-type active areas 58 can each have a rectangular ring shape. However, persons of ordinary skill in the art will appreciate that other configurations for the n-wells 54b-54c, n-type active areas 56b-56c, and p-type active areas 58 are possible.

A first NPN bipolar transistor 61 can be formed from the n-well 54a, the background p-type substrate 52, and the n-well 54b. In particular, the first NPN bipolar transistor 61 can have an emitter formed from the n-well 54a, a collector formed from the n-well 54b, and a base formed from the p-type substrate 52. The n-type active area 56a can be used to contact the emitter, the n-type active area 56b can be used to contact the collector, and the p-type active area 58 can be used to contact the base.

The base-collector PN junction of the first NPN bipolar transistor 61 can be used as a protection diode, such as the diode 48 of FIG. 5A. To reduce the leakage of the protection diode, the bias circuit 34 can be used to control the voltage potential of the collector. For example, as described above with reference to FIG. 3, the bias circuit 34 can bias the collector voltage so that the magnitude of the difference between the emitter and collector voltages is less than about 10 mV when the base-emitter voltage is between about 0 mV and about 100 mV. Additional details of the bias circuit 34 can be as described earlier.

The protection diode can employ the n-well 54c as a guard ring to help prevent the injection of charge carriers into other circuits formed on the substrate 52. Inclusion of the n-well 54c can aid in avoiding circuit latch-up by collecting charge carriers injected into the substrate 52 during an ESD event. The n-type diffusion region 56c can be electrically connected to a relatively low impedance node, such as a positive power supply $V_{CC}$, so that the carriers injected into the n-well 54c can be collected before reaching other circuits on the substrate 52.

The inclusion of the n-well 56c can inherently result in the formation of a second NPN bipolar transistor 62 from the n-well 54a, the substrate 52, and the n-well 54c. In particular, the second NPN bipolar transistor 62 can have an emitter formed from the n-well 54a, a collector formed from the n-well 54c, and a base formed from the substrate 52. The n-type active area 56a can be used to contact the emitter, the n-type active area 56b can be used to contact the collector, and the p-type active area 58 can be used to contact the base.

The n-well 54c (acting as a collector in the described bipolar transistor) can be connected to a fixed voltage to enhance the operation of the n-well 56c as a guard ring. Without sufficient spacing, the n-well 54c can act as a collector which is not biased by the bias circuit 34. To minimize the impact of the n-well 54c on the leakage current, the n-well 54b can be spaced from the n-well 54a by a first spacing $d_1$, and the n-well 54c can be spaced from the n-well 54b by a second spacing $d_2$, which is greater than the first spacing $d_1$. This can enhance the operation of the n-well 56b as a collector, while reducing the impact on leakage caused by the n-well 56c.

In one embodiment, the first spacing $d_1$ is selected to be less than about the diffusion length $L_n$, to aid in enhancing the operation of the n-well 56b as a collector. Additionally, the second spacing $d_2$ can be selected to be greater than the diffusion length $L_n$, by about a factor of three, to aid in reducing the impact of n-well 56c on leakage current.

Figure 6A:
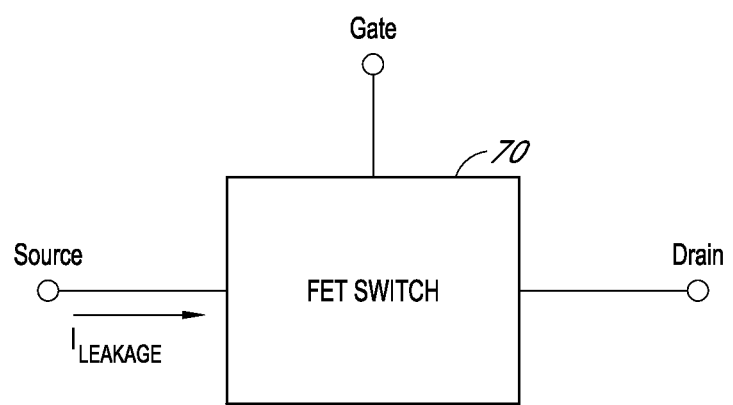
FIG. 6A is a block diagram of a field-effect transistor (FET) switch in accordance with one embodiment.

FIG. 6A is a block diagram of a field-effect transistor (FET) switch 70 in accordance with one embodiment. The switch 70 includes a source, a drain and a gate. As skilled artisans will appreciate, a voltage of the gate can be varied to control the flow of current from the source to the drain. However, even when the gate voltage is biased to stop the flow of charge from the source to the drain, a leakage current $I_{LEAKAGE}$ can still be present due to parasitic diode formations, as will be described below. For a low-leakage switch, reducing the leakage current $I_{LEAKAGE}$ can be desirable.

Figure 6B:
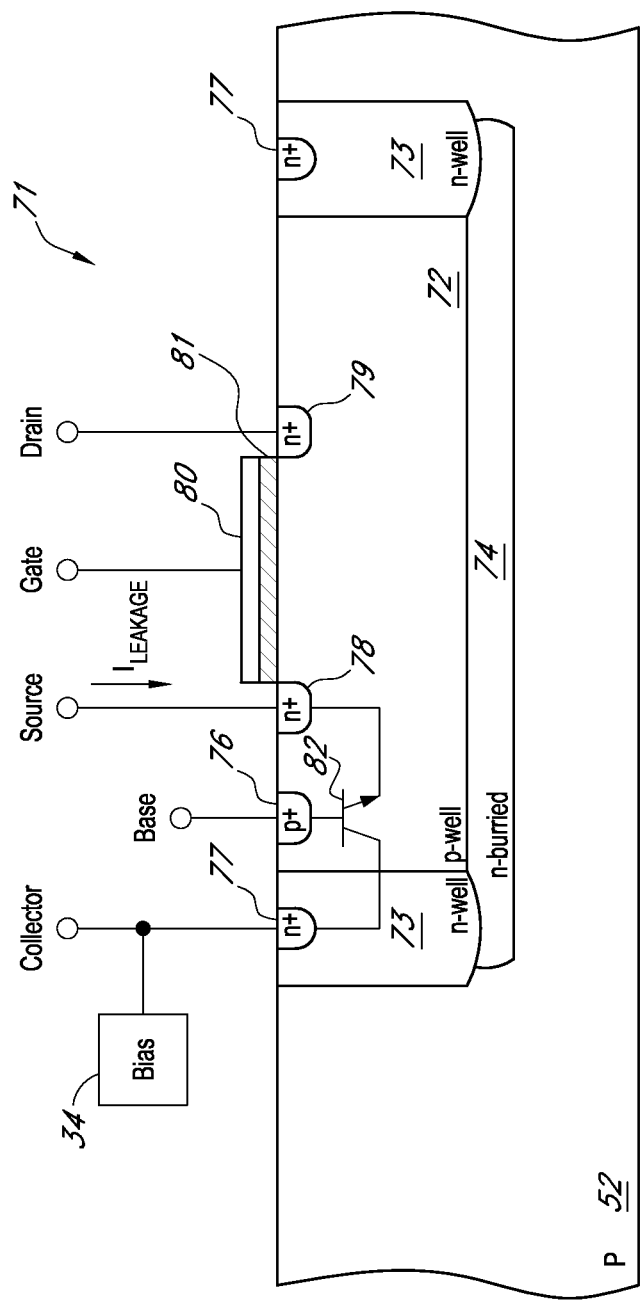
FIG. 6B is a cross section of a FET switch in accordance with one embodiment.

FIG. 6B is a cross section of a FET switch 71 in accordance with one embodiment. The FET switch 71 includes a substrate 52, a p-well 72, n-well 73, n-type buried layer 74, p-type active area 76, n-type active areas 77-79, a gate 80, and a gate dielectric 81. The FET switch 71 can be biased by the bias circuit 34. As skilled artisans will appreciate, n-well 73 and n-type active area 77 can each be annularly shaped, such as rectangular-shaped rings, when viewed from above the substrate 52. However, persons of ordinary skill in the art will appreciate that other configurations for n-well 73 and n-type active area 77 are possible.

The FET switch 71 includes the n-type diffusion area 78 formed in the p-well 72. The n-type diffusion area 79 can be disposed in the p-well 72 adjacent the n-type diffusion area 78. The n-type diffusion areas 78, 79 serve as the source and drain of the FET switch 71, respectively. The p-well 72 serves as the body of the FET switch 71. The gate dielectric 81 is formed between the n-type diffusion areas 78, 79 on a surface of the p-well 72. The gate 80 is disposed over the gate dielectric 81.

The n-well 73 and the n-type buried layer 74 can serve as an isolation structure for electrically isolating the p-well 72 from the substrate 52. Electrically isolating the p-well 72 from the substrate 52 can be advantageous in permitting the FET switch 71 to have a well or body voltage different from the bias voltage of the substrate 52. The p-well 72 of the FET switch 71 can be electrically contacted using the p-type diffusion area 76, and the n-type active areas 77 can be used to electrically contact n-well 73 and n-type buried layer 74. The n-type buried layer 74 can be any suitable buried layer for electrically isolating the p-well 72 from the substrate 52, such as a deep n-well or an n+ buried layer.

A parasitic NPN bipolar transistor 82 can be present in the structure of the FET switch 71. In particular, the parasitic NPN bipolar transistor 82 can have an emitter formed from the n-type active area 78, a base formed from the p-well 72, and a collector formed from the n-well 73. The base-collector junction of the NPN bipolar transistor 82 can act as PN junction diode. The leakage of the PN junction diode formed between the n-type diffusion area 78 and the p-well 72 can increase the leakage current $I_{LEAKAGE}$ of the FET switch 71.

To reduce the leakage current $I_{LEAKAGE}$, the bias circuit 34 can be used to control the voltage potential of the collector of the parasitic NPN bipolar transistor 82. The bias circuit 34 can bias the collector voltage so that the magnitude of the difference between the emitter and collector voltages is less than about 10 mV, more particularly less than about 5 mV, when the base-emitter reverse-bias voltage is between about 0 mV and about 100 mV. Additional details of the bias circuit 34 can be as described earlier.

Figure 7:
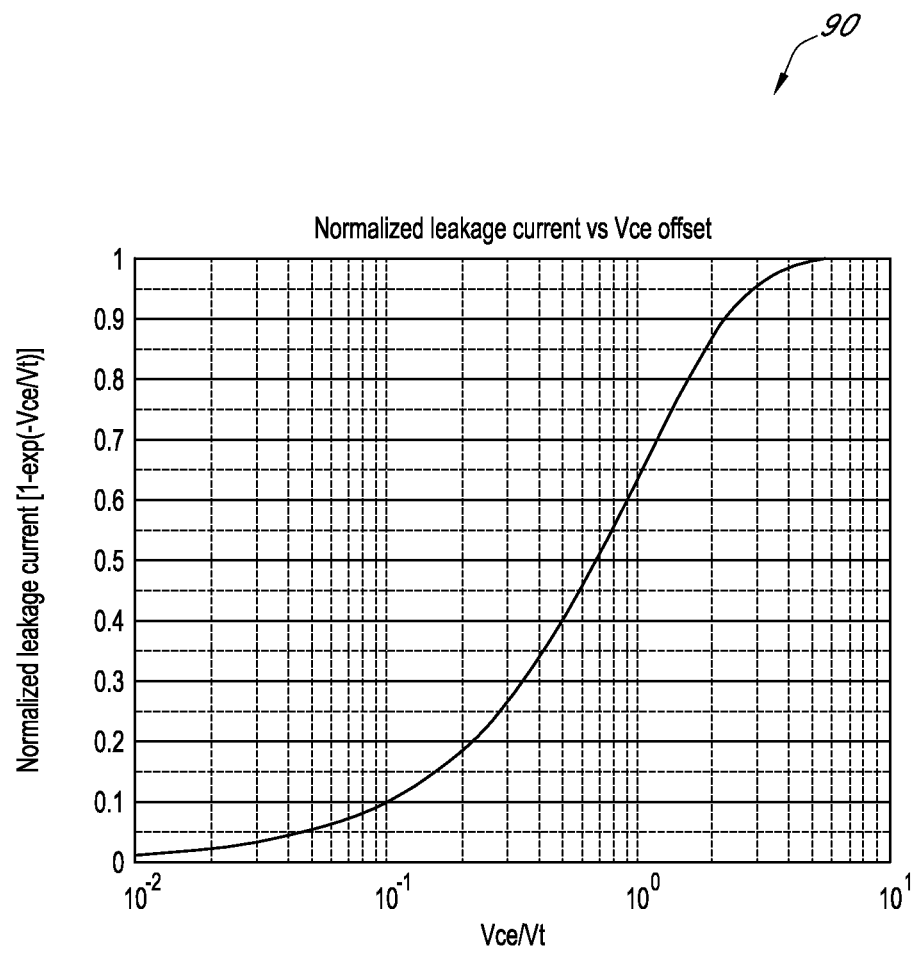
FIG. 7 is a graph of normalized leakage current versus normalized collector-emitter voltage offset, in accordance with one embodiment.

FIG. 7 is a graph 90 of normalized leakage current versus collect-emitter voltage offset. The graph 90 illustrates a normalized magnitude of the $Ie_{DIFFUSION}$ component of the leakage current of Equation 5 as a function of a normalized difference between the collector and emitter voltages. The graph 90 is illustrated for a case in which the ratio of $W/L_n$ is relatively small, such that $\text{sech}(W/L_n)$ has a value of about one. The voltage difference between collector and emitter has been normalized with respect to a variable Vt equal to kT/q, and the leakage current has been normalized with respect to $$\frac{qA_{Eni}^2 D_n}{N_A L_n} \coth\left(\frac{W}{L_n}\right).$$

As shown in the graph 90, as the difference between the collector and emitter voltages increases, the $Ie_{DIFFUSION}$ component of the leakage current also increases. The graph 90 demonstrates the impact of the difference between the emitter and collector voltages on the $Ie_{DIFFUSION}$ component of the leakage current. For example, when the difference between the collector and emitter voltages is equal to about one-tenth of Vt, the normalized leakage current is equal to about 10% its maximum value (corresponding to a reduction in the $Ie_{DIFFUSION}$ component of the leakage current of about 90%).

In one embodiment, the bias circuit is configured to bias the collector voltage so that the magnitude of the difference between the emitter and collector voltages is less than about one-third kT/q, more particularly less than about one-sixth kT/q, when the base-emitter reverse-bias voltage is between about zero and about four times kT/q. Furthermore, for base-emitter reverse-bias voltages greater than about four times kT/q, the bias circuit is configured to bias the collector voltage so that the collector-base PN junction is reversed biased with a voltage greater than about eleven-thirds kT/q.

The foregoing description and claims may refer to elements or features as being "connected" together. As used herein, unless expressly stated otherwise, "connected" means that one element/feature is directly or indirectly connected to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Applications

Devices employing the above described leakage control schemes can be implemented into various electronic devices. Examples of the electronic devices can include, but are not limited to, consumer electronic products, parts of the consumer electronic products, electronic test equipment, etc. Examples of the electronic devices can also include memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products, including those for industrial, medical and automotive applications. The leakage control schemes described herein can be useful for modifying diodes providing ESD protection, such as ESD diodes used in sensor applications.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
   a bipolar transistor configured to operate as a diode, wherein the diode can be biased in a forward-biased mode of operation, a reverse-biased mode of operation, and an equilibrium mode of operation, the bipolar transistor comprising:
   an emitter configured to operate as a first terminal of the diode;
   a base configured to operate as a second terminal of the diode; and
   a collector configured to receive a collector bias voltage, wherein the collector bias voltage is configured to be different than a voltage of the base when the diode is in the reverse-biased mode of operation, and wherein the collector bias voltage is configured relative to a voltage of the emitter to substantially minimize a diffusion leakage current; and
   a bias circuit configured to generate the collector bias voltage, wherein the bias circuit comprises a gain circuit having an input and an output, wherein the output of the gain circuit is electrically connected to the collector, and wherein the input of the gain circuit is electrically connected to the emitter.

2. The apparatus of claim 1, wherein the bipolar transistor is an NPN bipolar transistor, and wherein the first terminal of the diode is a cathode, and wherein the second terminal of the diode is an anode.

3. The apparatus of claim 1, wherein the bipolar transistor is a PNP bipolar transistor, and wherein the first terminal of the diode is an anode, and wherein the second terminal of the diode is a cathode.

4. The apparatus of claim 1, wherein the apparatus comprises an integrated circuit that includes the bipolar transistor.

5. An apparatus comprising:
a bipolar transistor configured to operate as a diode, wherein the diode can be biased in a forward-biased mode of operation, a reverse-biased mode of operation, and an equilibrium mode of operation, the bipolar transistor comprising:
an emitter configured to operate as a first terminal of the diode;
a base configured to operate as a second terminal of the diode; and
a collector configured to receive a collector bias voltage, wherein the collector bias voltage is configured to be different than a voltage of the base when the diode is in the reverse-biased mode of operation, and wherein the collector bias voltage is configured relative to a voltage of the emitter to substantially minimize a diffusion leakage current; and
a bias circuit configured to generate the collector bias voltage, wherein the bias circuit comprises an operational amplifier having a positive input, a negative input, and an output, wherein the output is electrically connected to the collector and to the negative input, and wherein the positive input is electrically connected to the emitter.

6. The apparatus of claim 5, wherein an offset voltage of the operational amplifier between the positive input and the negative input has a magnitude less than about 10 mV.

7. An apparatus comprising:
a bipolar transistor configured to operate as a diode, wherein the diode can be biased in a forward-biased mode of operation, a reverse-biased mode of operation, and an equilibrium mode of operation, the bipolar transistor comprising:
an emitter configured to operate as a first terminal of the diode;
a base configured to operate as a second terminal of the diode; and
a collector configured to receive a collector bias voltage, wherein the collector bias voltage is configured to be different than a voltage of the base when the diode is in the reverse-biased mode of operation, and wherein the collector bias voltage is configured relative to a voltage of the emitter to substantially minimize a diffusion leakage current; and
a bias circuit configured to generate the collector bias voltage, wherein the bias circuit is configured to control the collector bias voltage so that a difference between the collector bias voltage and a voltage of the emitter has a magnitude less than about one-third kT/q when the diode is reverse-biased by a voltage ranging between about zero to about four times kT/q, wherein k is Boltzmann's constant, T is temperature, and q is the magnitude of the charge of an electron.

8. An apparatus comprising:
a bipolar transistor configured to operate as a diode, wherein the diode can be biased in a forward-biased mode of operation, a reverse-biased mode of operation, and an equilibrium mode of operation, the bipolar transistor comprising:
an emitter configured to operate as a first terminal of the diode;
a base configured to operate as a second terminal of the diode; and
a collector configured to receive a collector bias voltage, wherein the collector bias voltage is configured to be different than a voltage of the base when the diode is in the reverse-biased mode of operation, and wherein the collector bias voltage is configured relative to a voltage of the emitter to substantially minimize a diffusion leakage current; and
a bias circuit configured to generate the collector bias voltage, wherein the bias circuit is configured to control the collector bias voltage so that a difference between the collector bias voltage and a voltage of the emitter has a magnitude less than about 10 mV when the diode is reverse-biased by a voltage ranging between about 0 mV to about 100 mV.

9. The apparatus of claim 8, wherein the bias circuit is configured to bias the collector bias voltage such that a reverse bias voltage between the base and the collector is greater than about 90 mV when the diode is reverse-biased by a voltage greater than about 100 mV.

10. An apparatus comprising:
an integrated circuit that includes a bipolar transistor, the bipolar transistor configured to operate as a diode, wherein the diode can be biased in a forward-biased mode of operation, a reverse-biased mode of operation, and an equilibrium mode of operation, the bipolar transistor comprising:
an emitter configured to operate as a first terminal of the diode;
a base configured to operate as a second terminal of the diode; and
a collector configured to receive a collector bias voltage, wherein the collector bias voltage is configured to be different than a voltage of the base when the diode is in the reverse-biased mode of operation, and wherein the collector bias voltage is configured relative to a voltage of the emitter to substantially minimize a diffusion leakage current; and
a bonding pad disposed on a surface of the integrated circuit, wherein the bonding pad is electrically connected to an internal circuit of the integrated circuit and to at least one of the emitter and base of the bipolar transistor, and wherein the bipolar transistor is configured to protect the internal circuit from electrostatic discharge events received on the pad.

11. The apparatus of claim 10, further comprising a bias circuit configured to generate the collector bias voltage.

12. The apparatus of claim 11, wherein the bias circuit comprises a gain circuit having an input and an output, wherein the output of the gain circuit is electrically connected to the collector, and wherein the input of the gain circuit is electrically connected to the emitter.

13. The apparatus of claim 10, wherein the internal circuit is a complementary metal-oxide-semiconductor (CMOS) amplifier.

14. The apparatus of claim 13, wherein the apparatus comprises a field effect transistor switch, the switch having a source, a drain, a gate, a semiconductor body, and an isolation structure disposed in a substrate, and wherein the source acts as the emitter of the bipolar transistor and the semiconductor body acts as the base of the bipolar transistor.

15. The apparatus of claim 14, wherein the source and drain are disposed in the semiconductor body, and wherein the gate is disposed between the source and drain adjacent a surface of the semiconductor body, and wherein the isolation structure surrounds the semiconductor body so as to electrically isolate the semiconductor body from the substrate.

16. The apparatus of claim 14, wherein the isolation structure acts as the collector of the bipolar transistor.

17. The apparatus of claim 14, wherein the switch is an n-type switch, and wherein the isolation structure comprises an n-well and an n-type buried layer.

* * * * *